United States Patent
Mogre et al.

(10) Patent No.: US 7,630,456 B2
(45) Date of Patent: Dec. 8, 2009

(54) METHOD AND/OR APPARATUS TO EFFICIENTLY TRANSMIT BROADBAND SERVICE CONTENT USING LOW DENSITY PARITY CODE BASED CODED MODULATION

(75) Inventors: Advait M. Mogre, Sunnyvale, CA (US); Atousa Haj-Shir-Mohammadi, Cupertino, CA (US); Toshiyaki Yoshino, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 711 days.

(21) Appl. No.: 10/237,768

(22) Filed: Sep. 9, 2002

(65) Prior Publication Data

US 2004/0047433 A1    Mar. 11, 2004

(51) Int. Cl.
    *H04L 27/20* (2006.01)
(52) U.S. Cl. .................. 375/308; 375/261; 375/340; 375/295; 375/298; 370/320; 370/252; 370/316; 370/343; 714/790; 714/795; 714/752; 714/792
(58) Field of Classification Search ............... 375/308, 375/295, 261, 340, 298; 714/792, 782, 800, 714/795, 790, 752, 786; 370/468, 252, 320, 370/316, 343; 348/607, 608
See application file for complete search history.

(56) References Cited

U.S. PATENT DOCUMENTS

| | | | | |
|---|---|---|---|---|
| 5,745,522 A | * | 4/1998 | Heegard | 380/46 |
| 5,801,790 A | * | 9/1998 | Limberg | 348/607 |
| 6,154,871 A | * | 11/2000 | Claydon et al. | 714/795 |
| 6,473,010 B1 | * | 10/2002 | Vityaev et al. | 341/107 |
| 6,633,856 B2 | * | 10/2003 | Richardson et al. | 706/15 |
| 6,751,197 B1 | * | 6/2004 | Sadanaka | 370/252 |
| 7,000,174 B2 | * | 2/2006 | Mantha et al. | 714/790 |
| 7,000,714 B2 | * | 2/2006 | Gessay et al. | 175/424 |
| 2002/0042899 A1 | * | 4/2002 | Tzannes et al. | 714/786 |
| 2002/0080887 A1 | * | 6/2002 | Jeong et al. | 375/295 |
| 2002/0194570 A1 | * | 12/2002 | Birru et al. | 714/792 |
| 2003/0007508 A1 | * | 1/2003 | Sala et al. | 370/468 |
| 2005/0114748 A9 | * | 5/2005 | Shen et al. | 714/752 |
| 2005/0149844 A1 | * | 7/2005 | Tran et al. | 714/800 |
| 2005/0229088 A1 | * | 10/2005 | Tzannes et al. | 714/800 |

\* cited by examiner

*Primary Examiner*—Chieh M Fan
*Assistant Examiner*—Eva Y Puente
(74) *Attorney, Agent, or Firm*—Christopher P. Maiorana, PC

(57) ABSTRACT

An apparatus comprising a first circuit and a second circuit. The first circuit may be configured to generate an MPEG packet data stream. The second circuit may be configured to (i) scramble the data stream to generate a scrambled data stream, (ii) encode the scrambled data stream to generate an encoded data stream, (iii) interleave the encoded data stream, (iv) encode the interleaved data stream, (v) modulate the encoded data stream, and (vi) filter the modulated data stream.

27 Claims, 5 Drawing Sheets

METHOD AND/OR APPARATUS TO EFFICIENTLY TRANSMIT BROADBAND SERVICE CONTENT USING LOW DENSITY PARITY CODE BASED CODED MODULATION

FIELD OF THE INVENTION

The present invention relates to a method of transmitting digital signals generally and, more particularly, to a method and/or architecture to efficiently transmit broadband service content using low density parity code based coded modulation.

BACKGROUND OF THE INVENTION

With the proliferation of broadband transmission media such as digital satellite television, digital cable, cable modem, and DSL, several error correcting transmission protocols have emerged. Conventional standards like Integrated Services Digital Broadcasting Satellite (ISDB-S) that deploy QuadraPhase-Shift Keying (QPSK) or 8 level Phase-Shift Keying (8PSK) based systems use conventional forward error correction techniques. Such techniques allow transmission of standard and High Definition Digital Television (HDTV) signals over satellite by using a higher bandwidth and transmitting power to be able to deliver digital television channels.

The following TABLE 1 illustrates an example of a conventional target satellite system performance specification:

TABLE 1

| Item | | Min | Typ | Max | Unit |
|---|---|---|---|---|---|
| 1 | Payload | 41 | — | — | Mbps |
| 2 | Code | TBD | — | TBD | |
| 3 | QEF | 10E − 11 | — | — | |
| 4 | Symbol | 20 | 22 | 23 | MSps |
| 5 | Eb/No @ 10E − 1 | | | | |
| | 2/3 or | — | — | 4 | dB |
| | 5/6 or | — | — | 4.6 | dB |
| | 8/9 | — | — | 5.2 | dB |
| 6 | Dish | — | — | 46 | cm |
| 7 | Satellite EIRP for 8 PSK with respect to QPSK transponders | +2.6 | — | — | dB |
| 8 | C/No for QPSK 20 Msps. 3/4 | — | 78.9 | — | dB |

These specifications can vary based on the broadband carrier environment. Conventional QPSK based transmission systems do not achieve high definition digital television (i.e., 720 p or 1080 i) with the given constraints of bandwidth and available transmission power.

It would be desirable to develop a television system specification in response to system performance goals for the design and development of a Low Density Parity Check (LDPC) code based Forward Error Correction (FEC) system for use in broadband gateways.

SUMMARY OF THE INVENTION

The present invention concerns an apparatus comprising a first circuit and a second circuit. The first circuit may be configured to generate an MPEG packet data stream. The second circuit may be configured to (i) scramble the data stream to generate a scrambled data stream, (ii) encode the scrambled data stream to generate an encoded data stream, (iii) interleave the encoded data stream, (iv) encode the interleaved data stream, (v) modulate the encoded data stream, and (vi) filter the modulated data stream.

The objects, features and advantages of the present invention include providing a system to efficiently transmit broadband service content using low density parity code based coded modulation that may (i) operate efficiently and effectively using the preexisting bandwidth allocated to television signals, and/or (ii) avoid attenuation problems when broadcast at preexisting transmission power levels.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may involve a Low Density Parity Check (LDPC) based Forward Error Correcting (FEC) subsystem for digital broadcasting. The present invention may be particularly suited as part of a satellite system physical layer deployed in a consumer grade set-top box to receive Direct Broadcast Satellite (DBS) transmissions as a carrier for High Definition (HD) programming. The present invention may allow additional high definition channels to be broadcasted and decoded using the same bandwidth as conventional approaches use to deliver fewer channels. Initially, the use of the 8 Level Phase-Shift Keying (8PSK) modulated channels of the present invention may only be applied to select transponders, while the majority of transponders may continue to use QuadraPhase-Shift Keying (QPSK) in Digital Video Broadcasting/Digital Signature Standard (DVB/DSS) format. By initially introducing the 8PSK modulated channels to limited transponders, end users will have an opportunity to upgrade. Furthermore, by introducing 8PSK modulation to additional new programming choices, end users will have an incentive to implement the present invention. Furthermore, if channels that an end user is accustomed to receiving with conventional QPSK are still available during the transition, consumer satisfaction may be improved. While the digital satellite television serves as a specific example, the FEC portion of which the LDPC decoder forms a part may be suitably parameterized to be flexible enough to be used in other applications such as terrestrial or cable based broadband systems.

The present invention may be designed to comply with the conventional target satellite system performance specifications discussed in the background section. The present invention may be implemented as a stand alone decoder, or as an upgrade to conventional decoders. The transmission system of the present invention may begin with channel coding. The channel coding for the class of broadband applications that the present invention is most suited for may be based on a family of iteratively decoded codes known as Low Density Parity Checks (LDPCs). Simulation results are presented for a given Finite Geometry (FG) LDPC code, but may not be restricted to this choice. However, any appropriate type of coding may be used to meet the design criteria of a particular application.

Figure 1:
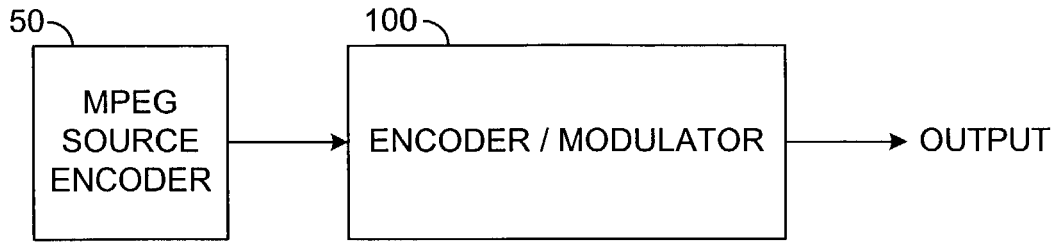
FIG. 1 is a diagram illustrating the context of the present invention.

Referring to FIG. 1, a diagram illustrating the context of the present invention is shown. The present invention 100 may be a circuit and/or process designed to receive an MPEG encoded digital video signal from an MPEG source encoder 50. The MPEG encoded digital video signal may be, in one example, the raw MPEG signal read from a DVD. The signal may be provided from the encoder 50 as MPEG source input framing packets. In one example, the present invention 100 may process, encode, and/or modulate an MPEG encoded digital video signal.

Figure 2:
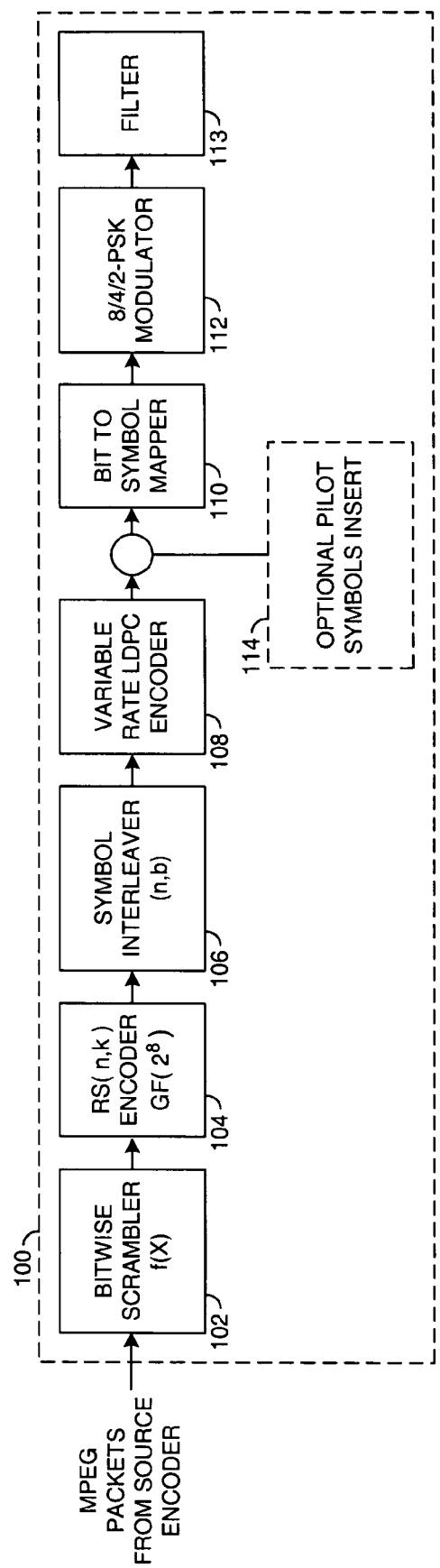
FIG. 2 is a diagram illustrating a preferred embodiment of the present invention.

Referring to FIG. 2, a diagram illustrating a method (or process) 100 in accordance with a preferred embodiment of the present invention is shown. The process 100 illustrates an example of a system incorporating LDPCs. The process 100 may have seven main processing stages 102, 104, 106, 108, 110, 112 and 113 and one optional stage 114. The stage 102 may be implemented as a bitwise scrambling stage. The stage 102 may receive MPEG source input framing packets from a source encoder. The stage 104 may implement an outer coding process. The stage 106 may comprise a symbol or frame interleaving stage. The stage 108 may implement a variable rate LDPC inner encoding process. The stage 110 may implement a modulation process and a bit-to-symbol mapping stage. The stage 112 may implement a 8/4/2-Phase-Shift Keying (8/4/2-PSK) modulator. The stage 113 may implement a filtering process. The optional stage 114 may be implemented between the stages 108 and 110 and may comprise a synchronization stage. Alternatively, FIG. 2 may be viewed as a Digital Signal Processing (DSP) diagram. The eight stages of FIG. 2 may be viewed as each comprising a circuit configured to achieve the objective of the particular stage.

Prior to the stage 102, transport stream (TS) bytes from an MPEG-2 source encoder may be packed into a packet structure. In a typical example, each packet may contain 187 data payload bytes. Two hundred of such data payload packets (e.g., 37400 bytes) may comprise one basic data frame.

Figure 3:
FIG. 3 is a diagram illustrating an example of a MPEG-2 data payload packet.
Figure 4:
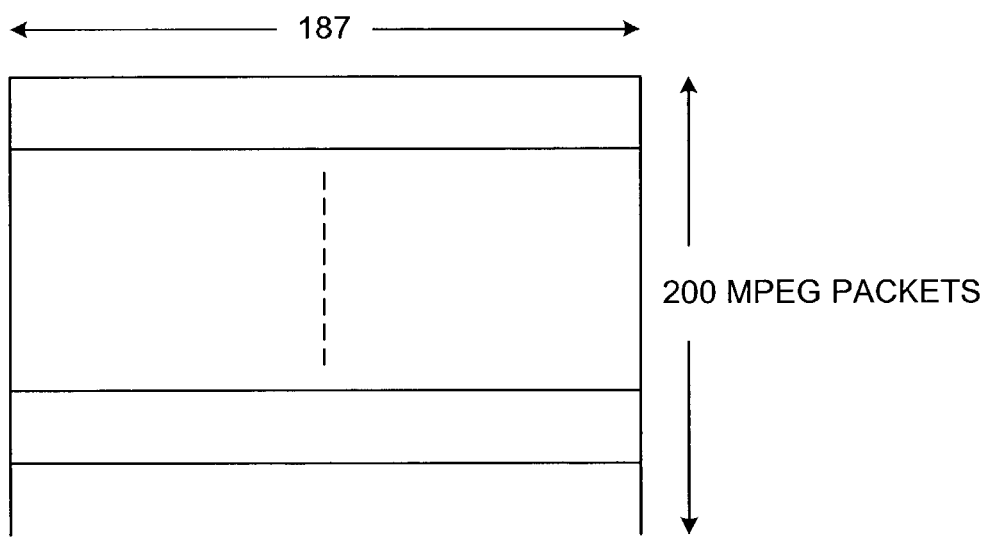
FIG. 4 is a diagram illustrating an example of a MPEG-2 data frame.
Figure 5:
FIG. 5 is a diagram illustrating a more detailed view of the data frame of FIG. 4.

FIG. 3 illustrates an example of a single MPEG-2 data payload packet 150 comprising 187 bytes arranged in a contiguous block. FIG. 4 illustrates an example of a basic data frame 160 comprising 200 187 byte MPEG-2 data payload packets 150 contiguously arranged in a block. FIG. 5 is an example 170 of a more detailed view of the elements of the basic MPEG-2 data frame 160 of FIG. 4. A sync. byte (e.g., a value of 47 in hexadecimal representation) may be inserted before every packet 150 to indicate the beginning of a packet being transmitted. Before the very first packet, an inverted sync. byte (e.g., a value of b8 in hexadecimal) may be inserted to enable proper synchronization of the data frame 160.

Referring back to FIG. 2, the stage 102 may comprise energy dispersal. The stage 102 may receive the MPEG data frames 160 illustrated in FIG. 4 from the source encoder 50. To ensure adequate transitions for proper timing recovery, bit-wise energy dispersal (e.g., randomization) may be carried out as in the Digital Video Broadcasting Satellite (DVB-S) specification. In one example, the polynomial chosen for the Pseudo-Random Binary Sequence (PRBS) generation may be given by $f(x)=1+x^{14}+x^{15}$. A bit sequence (e.g., 100101010000000) may be loaded into a shift register at the start of the MPEG source frame and subsequently, at the beginning of every 8 MPEG transport packets. The very first sync. byte position at the start of the source frame may be marked in an MPEG TS stream by the inverted MPEG sync. byte (e.g., a value of b8 in hexadecimal) as shown in FIG. 5. The scrambling operation may be disabled at the first of every 8 sync. bytes (e.g., at the beginning of each scrambling cycle comprising 8×188=1536 bit intervals). Thus, the inverted sync. byte at the beginning of the source frame may remain unaffected.

Figure 6:
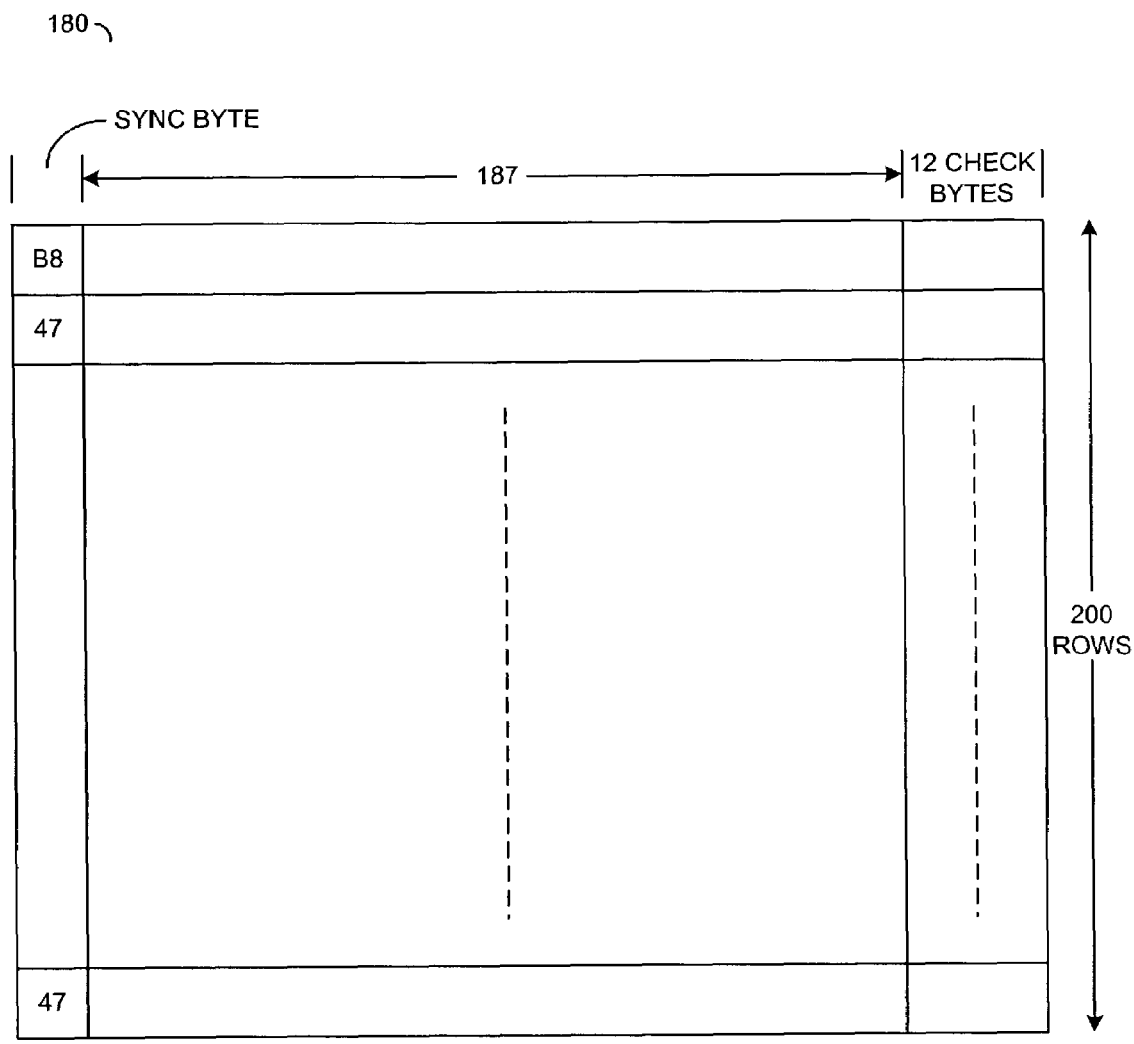
FIG. 6 is a diagram illustrating an example of a data frame after Reed-Solomon encoding.

Referring to FIG. 6, a complete Reed-Solomon (RS) encoded frame 180 is shown. The stage 104 may comprise outer coding (e.g., RS(200,188)). Prior to transmission, the transport bytes in each frame may be encoded by a shortened Reed-Solomon encoder of length 200 and error correcting capability t=6 (e.g., the systematic code word may contain 12 check bytes after 188 input data bytes). The RS(200,188) code defined over a Galors Field $GF[2^8]$ may have the same generator and binary primitive polynomials as a DVB-S code applying RS(204,188). Thus, each RS encoded frame 180 generated by the stage 104 may then comprise ((1+187)+12)×200=200×200=40,000 bytes.

The stage 106 may comprise symbol or frame interleaving. In order to decimate the error events created by the inner LDPC decoder at the receiver, a block interleaver (e.g., frame size 200×200) may be used on the output frames 180 of the Reed-Solomon encoder of the stage 104. The interleaving operation may be synchronized by using a frame start signal aligned at the start of the inverted sync. byte from the beginning of the first RS code word of the encoded frame. The stage 106 may add parity to the data stream provided to the subsequent stage 108 to greatly reduce the probability of bit errors occurring at the receiver decoder during decoding.

The following TABLE 2 illustrates a 255×175 [H] matrix that is shown to be applied in the following example:

TABLE 2

| 1  | 14 | 23 | 39 | 46 | 60 | 88  | 143 | 144 | 155 | 163 | 215 | 221 | 225 | 251 | 254 |
| 0  | 13 | 22 | 38 | 45 | 59 | 87  | 142 | 143 | 154 | 162 | 214 | 220 | 224 | 250 | 253 |
| 12 | 21 | 37 | 44 | 58 | 86 | 141 | 142 | 153 | 161 | 213 | 219 | 223 | 249 | 252 | 254 |
| 11 | 20 | 36 | 43 | 57 | 85 | 140 | 141 | 152 | 160 | 212 | 218 | 222 | 248 | 251 | 253 |
| 10 | 19 | 35 | 42 | 56 | 84 | 139 | 140 | 151 | 159 | 211 | 217 | 221 | 247 | 250 | 252 |
| 9  | 18 | 34 | 41 | 55 | 83 | 138 | 139 | 150 | 158 | 210 | 216 | 220 | 246 | 249 | 251 |
| 8  | 17 | 33 | 40 | 54 | 82 | 137 | 138 | 149 | 157 | 209 | 215 | 219 | 245 | 248 | 250 |
| 7  | 16 | 32 | 39 | 53 | 81 | 136 | 137 | 148 | 156 | 208 | 214 | 218 | 244 | 247 | 249 |
| 6  | 15 | 31 | 38 | 52 | 80 | 135 | 136 | 147 | 155 | 207 | 213 | 217 | 243 | 246 | 248 |
| 5  | 14 | 30 | 37 | 51 | 79 | 134 | 135 | 146 | 154 | 206 | 212 | 216 | 242 | 245 | 247 |

TABLE 2-continued

| | | | | | | | | | | | | | | |
|---|---|---|---|---|---|---|---|---|---|---|---|---|---|---|
| 4 | 13 | 29 | 36 | 50 | 78 | 133 | 134 | 145 | 153 | 205 | 211 | 215 | 241 | 244 | 246 |
| 3 | 12 | 28 | 35 | 49 | 77 | 132 | 133 | 144 | 152 | 204 | 210 | 214 | 240 | 243 | 245 |
| 2 | 11 | 27 | 34 | 48 | 76 | 131 | 132 | 143 | 151 | 203 | 209 | 213 | 239 | 242 | 244 |
| 1 | 10 | 26 | 33 | 47 | 75 | 130 | 131 | 142 | 150 | 202 | 208 | 212 | 238 | 241 | 243 |
| 0 | 9 | 25 | 32 | 46 | 74 | 129 | 130 | 141 | 149 | 201 | 207 | 211 | 237 | 240 | 242 |
| 8 | 24 | 31 | 45 | 73 | 128 | 129 | 140 | 148 | 200 | 206 | 210 | 236 | 239 | 241 | 254 |
| 7 | 23 | 30 | 44 | 72 | 127 | 128 | 139 | 147 | 199 | 205 | 209 | 235 | 238 | 240 | 253 |
| 6 | 22 | 29 | 43 | 71 | 126 | 127 | 138 | 146 | 198 | 204 | 208 | 234 | 237 | 239 | 252 |
| 5 | 21 | 28 | 42 | 70 | 125 | 126 | 137 | 145 | 197 | 203 | 207 | 233 | 236 | 238 | 251 |
| 4 | 20 | 27 | 41 | 69 | 124 | 125 | 136 | 144 | 196 | 202 | 206 | 232 | 235 | 237 | 250 |
| 3 | 19 | 26 | 40 | 68 | 123 | 124 | 135 | 143 | 195 | 201 | 205 | 231 | 234 | 236 | 249 |
| 2 | 18 | 25 | 39 | 67 | 122 | 123 | 134 | 142 | 194 | 200 | 204 | 230 | 233 | 235 | 248 |
| 1 | 17 | 24 | 38 | 66 | 121 | 122 | 133 | 141 | 193 | 199 | 203 | 229 | 232 | 234 | 247 |
| 0 | 16 | 23 | 37 | 65 | 120 | 121 | 132 | 140 | 192 | 198 | 202 | 228 | 231 | 233 | 246 |
| 15 | 22 | 36 | 64 | 119 | 120 | 131 | 139 | 191 | 197 | 201 | 227 | 230 | 232 | 245 | 254 |
| 14 | 21 | 35 | 63 | 118 | 119 | 130 | 138 | 190 | 196 | 200 | 226 | 229 | 231 | 244 | 253 |
| 13 | 20 | 34 | 62 | 117 | 118 | 129 | 137 | 189 | 195 | 199 | 225 | 228 | 230 | 243 | 252 |
| 12 | 19 | 33 | 61 | 116 | 117 | 128 | 136 | 188 | 194 | 198 | 224 | 227 | 229 | 242 | 251 |
| 11 | 18 | 32 | 60 | 115 | 116 | 127 | 135 | 187 | 193 | 197 | 223 | 226 | 228 | 241 | 250 |
| 10 | 17 | 31 | 59 | 114 | 115 | 126 | 134 | 186 | 192 | 196 | 222 | 225 | 227 | 240 | 249 |
| 9 | 16 | 30 | 58 | 113 | 114 | 125 | 133 | 185 | 191 | 195 | 221 | 224 | 226 | 239 | 248 |
| 8 | 15 | 29 | 57 | 112 | 113 | 124 | 132 | 184 | 190 | 194 | 220 | 223 | 225 | 238 | 247 |
| 7 | 14 | 28 | 56 | 111 | 112 | 123 | 131 | 183 | 189 | 193 | 219 | 222 | 224 | 237 | 246 |
| 6 | 13 | 27 | 55 | 110 | 111 | 122 | 130 | 182 | 188 | 192 | 218 | 221 | 223 | 236 | 245 |
| 5 | 12 | 26 | 54 | 109 | 110 | 121 | 129 | 181 | 187 | 191 | 217 | 220 | 222 | 235 | 244 |
| 4 | 11 | 25 | 53 | 108 | 109 | 120 | 128 | 180 | 186 | 190 | 216 | 219 | 221 | 234 | 243 |
| 3 | 10 | 24 | 52 | 107 | 108 | 119 | 127 | 179 | 185 | 189 | 215 | 218 | 220 | 233 | 242 |
| 2 | 9 | 23 | 51 | 106 | 107 | 118 | 126 | 178 | 184 | 188 | 214 | 217 | 219 | 232 | 241 |
| 1 | 8 | 22 | 50 | 105 | 106 | 117 | 125 | 177 | 183 | 187 | 213 | 216 | 218 | 231 | 240 |
| 0 | 7 | 21 | 49 | 104 | 105 | 116 | 124 | 176 | 182 | 186 | 212 | 215 | 217 | 230 | 239 |
| 6 | 20 | 48 | 103 | 104 | 115 | 123 | 175 | 181 | 185 | 211 | 214 | 216 | 229 | 238 | 254 |
| 5 | 19 | 47 | 102 | 103 | 114 | 122 | 174 | 180 | 184 | 210 | 213 | 215 | 228 | 237 | 253 |
| 4 | 18 | 46 | 101 | 102 | 113 | 121 | 173 | 179 | 183 | 209 | 212 | 214 | 227 | 236 | 252 |
| 3 | 17 | 45 | 100 | 101 | 112 | 120 | 172 | 178 | 182 | 208 | 211 | 213 | 226 | 235 | 251 |
| 2 | 16 | 44 | 99 | 100 | 111 | 119 | 171 | 177 | 181 | 207 | 210 | 212 | 225 | 234 | 250 |
| 1 | 15 | 43 | 98 | 99 | 110 | 118 | 170 | 176 | 180 | 206 | 209 | 211 | 224 | 233 | 249 |
| 0 | 14 | 42 | 97 | 98 | 109 | 117 | 169 | 175 | 179 | 205 | 208 | 210 | 223 | 232 | 248 |
| 13 | 41 | 96 | 97 | 108 | 116 | 168 | 174 | 178 | 204 | 207 | 209 | 222 | 231 | 247 | 254 |
| 12 | 40 | 95 | 96 | 107 | 115 | 167 | 173 | 177 | 203 | 206 | 208 | 221 | 230 | 246 | 253 |
| 11 | 39 | 94 | 95 | 106 | 114 | 166 | 172 | 176 | 202 | 205 | 207 | 220 | 229 | 245 | 252 |
| 10 | 38 | 93 | 94 | 105 | 113 | 165 | 171 | 175 | 201 | 204 | 206 | 219 | 228 | 244 | 251 |
| 9 | 37 | 92 | 93 | 104 | 112 | 164 | 170 | 174 | 200 | 203 | 205 | 218 | 227 | 243 | 250 |
| 8 | 36 | 91 | 92 | 103 | 111 | 163 | 169 | 173 | 199 | 202 | 204 | 217 | 226 | 242 | 249 |
| 7 | 35 | 90 | 91 | 102 | 110 | 162 | 168 | 172 | 198 | 201 | 203 | 216 | 225 | 241 | 248 |
| 6 | 34 | 89 | 90 | 101 | 109 | 161 | 167 | 171 | 197 | 200 | 202 | 215 | 224 | 240 | 247 |
| 5 | 33 | 88 | 89 | 100 | 108 | 160 | 166 | 170 | 196 | 199 | 201 | 214 | 223 | 239 | 246 |
| 4 | 32 | 87 | 88 | 99 | 107 | 159 | 165 | 169 | 195 | 198 | 200 | 213 | 222 | 238 | 245 |
| 3 | 31 | 86 | 87 | 98 | 106 | 158 | 164 | 168 | 194 | 197 | 199 | 212 | 221 | 237 | 244 |
| 2 | 30 | 85 | 86 | 97 | 105 | 157 | 163 | 167 | 193 | 196 | 198 | 211 | 220 | 236 | 243 |
| 1 | 29 | 84 | 85 | 96 | 104 | 156 | 162 | 166 | 192 | 195 | 197 | 210 | 219 | 235 | 242 |
| 0 | 28 | 83 | 84 | 95 | 103 | 155 | 161 | 165 | 191 | 194 | 196 | 209 | 218 | 234 | 241 |
| 27 | 82 | 83 | 94 | 102 | 154 | 160 | 164 | 190 | 193 | 195 | 208 | 217 | 233 | 240 | 254 |
| 26 | 81 | 82 | 93 | 101 | 153 | 159 | 163 | 189 | 192 | 194 | 207 | 216 | 232 | 239 | 253 |
| 25 | 80 | 81 | 92 | 100 | 152 | 158 | 162 | 188 | 191 | 193 | 206 | 215 | 231 | 238 | 252 |
| 24 | 79 | 80 | 91 | 99 | 151 | 157 | 161 | 187 | 190 | 192 | 205 | 214 | 230 | 237 | 251 |
| 23 | 78 | 79 | 90 | 98 | 150 | 156 | 160 | 186 | 189 | 191 | 204 | 213 | 229 | 236 | 250 |
| 22 | 77 | 78 | 89 | 97 | 149 | 155 | 159 | 185 | 188 | 190 | 203 | 212 | 228 | 235 | 249 |
| 21 | 76 | 77 | 88 | 96 | 148 | 154 | 158 | 184 | 187 | 189 | 202 | 211 | 227 | 234 | 248 |
| 20 | 75 | 76 | 87 | 95 | 147 | 153 | 157 | 183 | 186 | 188 | 201 | 210 | 226 | 233 | 247 |
| 19 | 74 | 75 | 86 | 94 | 146 | 152 | 156 | 182 | 185 | 187 | 200 | 209 | 225 | 232 | 246 |
| 18 | 73 | 74 | 85 | 93 | 145 | 151 | 155 | 181 | 184 | 186 | 199 | 208 | 224 | 231 | 245 |
| 17 | 72 | 73 | 84 | 92 | 144 | 150 | 154 | 180 | 183 | 185 | 198 | 207 | 223 | 230 | 244 |
| 16 | 71 | 72 | 83 | 91 | 143 | 149 | 153 | 179 | 182 | 184 | 197 | 206 | 222 | 229 | 243 |
| 15 | 70 | 71 | 82 | 90 | 142 | 148 | 152 | 178 | 181 | 183 | 196 | 205 | 221 | 228 | 242 |
| 14 | 69 | 70 | 81 | 89 | 141 | 147 | 151 | 177 | 180 | 182 | 195 | 204 | 220 | 227 | 241 |
| 13 | 68 | 69 | 80 | 88 | 140 | 146 | 150 | 176 | 179 | 181 | 194 | 203 | 219 | 226 | 240 |
| 12 | 67 | 68 | 79 | 87 | 139 | 145 | 149 | 175 | 178 | 180 | 193 | 202 | 218 | 225 | 239 |
| 11 | 66 | 67 | 78 | 86 | 138 | 144 | 148 | 174 | 177 | 179 | 192 | 201 | 217 | 224 | 238 |
| 10 | 65 | 66 | 77 | 85 | 137 | 143 | 147 | 173 | 176 | 178 | 191 | 200 | 216 | 223 | 237 |
| 9 | 64 | 65 | 76 | 84 | 136 | 142 | 146 | 172 | 175 | 177 | 190 | 199 | 215 | 222 | 236 |
| 8 | 63 | 64 | 75 | 83 | 135 | 141 | 145 | 171 | 174 | 176 | 189 | 198 | 214 | 221 | 235 |
| 7 | 62 | 63 | 74 | 82 | 134 | 140 | 144 | 170 | 173 | 175 | 188 | 197 | 213 | 220 | 234 |
| 6 | 61 | 62 | 73 | 81 | 133 | 139 | 143 | 169 | 172 | 174 | 187 | 196 | 212 | 219 | 233 |
| 5 | 60 | 61 | 72 | 80 | 132 | 138 | 142 | 168 | 171 | 173 | 186 | 195 | 211 | 218 | 232 |
| 4 | 59 | 60 | 71 | 79 | 131 | 137 | 141 | 167 | 170 | 172 | 185 | 194 | 210 | 217 | 231 |
| 3 | 58 | 59 | 70 | 78 | 130 | 136 | 140 | 166 | 169 | 171 | 184 | 193 | 209 | 216 | 230 |
| 2 | 57 | 58 | 69 | 77 | 129 | 135 | 139 | 165 | 168 | 170 | 183 | 192 | 208 | 215 | 229 |
| 1 | 56 | 57 | 68 | 76 | 128 | 134 | 138 | 164 | 167 | 169 | 182 | 191 | 207 | 214 | 228 |
| 0 | 55 | 56 | 67 | 75 | 127 | 133 | 137 | 163 | 166 | 168 | 181 | 190 | 206 | 213 | 227 |

TABLE 2-continued

| | | | | | | | | | | | | | | | |
|---|---|---|---|---|---|---|---|---|---|---|---|---|---|---|---|
| 54 | 55 | 66 | 74 | 126 | 132 | 136 | 162 | 165 | 167 | 180 | 189 | 205 | 212 | 226 | 254 |
| 53 | 54 | 65 | 73 | 125 | 131 | 135 | 161 | 164 | 166 | 179 | 188 | 204 | 211 | 225 | 253 |
| 52 | 53 | 64 | 72 | 124 | 130 | 134 | 160 | 163 | 165 | 178 | 187 | 203 | 210 | 224 | 252 |
| 51 | 52 | 63 | 71 | 123 | 129 | 133 | 159 | 162 | 164 | 177 | 186 | 202 | 209 | 223 | 251 |
| 50 | 51 | 62 | 70 | 122 | 128 | 132 | 158 | 161 | 163 | 176 | 185 | 201 | 208 | 222 | 250 |
| 49 | 50 | 61 | 69 | 121 | 127 | 131 | 157 | 160 | 162 | 175 | 184 | 200 | 207 | 221 | 249 |
| 48 | 49 | 60 | 68 | 120 | 126 | 130 | 156 | 159 | 161 | 174 | 183 | 199 | 206 | 220 | 248 |
| 47 | 48 | 59 | 67 | 119 | 125 | 129 | 155 | 158 | 160 | 173 | 182 | 198 | 205 | 219 | 247 |
| 46 | 47 | 58 | 66 | 118 | 124 | 128 | 154 | 157 | 159 | 172 | 181 | 197 | 204 | 218 | 246 |
| 45 | 46 | 57 | 65 | 117 | 123 | 127 | 153 | 156 | 158 | 171 | 180 | 196 | 203 | 217 | 245 |
| 44 | 45 | 56 | 64 | 116 | 122 | 126 | 152 | 155 | 157 | 170 | 179 | 195 | 202 | 216 | 244 |
| 43 | 44 | 55 | 63 | 115 | 121 | 125 | 151 | 154 | 156 | 169 | 178 | 194 | 201 | 215 | 243 |
| 42 | 43 | 54 | 62 | 114 | 120 | 124 | 150 | 153 | 155 | 168 | 177 | 193 | 200 | 214 | 242 |
| 41 | 42 | 53 | 61 | 113 | 119 | 123 | 149 | 152 | 154 | 167 | 176 | 192 | 199 | 213 | 241 |
| 40 | 41 | 52 | 60 | 112 | 118 | 122 | 148 | 151 | 153 | 166 | 175 | 191 | 198 | 212 | 240 |
| 39 | 40 | 51 | 59 | 111 | 117 | 121 | 147 | 150 | 152 | 165 | 174 | 190 | 197 | 211 | 239 |
| 38 | 39 | 50 | 58 | 110 | 116 | 120 | 146 | 149 | 151 | 164 | 173 | 189 | 196 | 210 | 238 |
| 37 | 38 | 49 | 57 | 109 | 115 | 119 | 145 | 148 | 150 | 163 | 172 | 188 | 195 | 209 | 237 |
| 36 | 37 | 48 | 56 | 108 | 114 | 118 | 144 | 147 | 149 | 162 | 171 | 187 | 194 | 208 | 236 |
| 35 | 36 | 47 | 55 | 107 | 113 | 117 | 143 | 146 | 148 | 161 | 170 | 186 | 193 | 207 | 235 |
| 34 | 35 | 46 | 54 | 106 | 112 | 116 | 142 | 145 | 147 | 160 | 169 | 185 | 192 | 206 | 234 |
| 33 | 34 | 45 | 53 | 105 | 111 | 115 | 141 | 144 | 146 | 159 | 168 | 184 | 191 | 205 | 233 |
| 32 | 33 | 44 | 52 | 104 | 110 | 114 | 140 | 143 | 145 | 158 | 167 | 183 | 190 | 204 | 232 |
| 31 | 32 | 43 | 51 | 103 | 109 | 113 | 139 | 142 | 144 | 157 | 166 | 182 | 189 | 203 | 231 |
| 30 | 31 | 42 | 50 | 102 | 108 | 112 | 138 | 141 | 143 | 156 | 165 | 181 | 188 | 202 | 230 |
| 29 | 30 | 41 | 49 | 101 | 107 | 111 | 137 | 140 | 142 | 155 | 164 | 180 | 187 | 201 | 229 |
| 28 | 29 | 40 | 48 | 100 | 106 | 110 | 136 | 139 | 141 | 154 | 163 | 179 | 186 | 200 | 228 |
| 27 | 28 | 39 | 47 | 99 | 105 | 109 | 135 | 138 | 140 | 153 | 162 | 178 | 185 | 199 | 227 |
| 26 | 27 | 38 | 46 | 98 | 104 | 108 | 134 | 137 | 139 | 152 | 161 | 177 | 184 | 198 | 226 |
| 25 | 26 | 37 | 45 | 97 | 103 | 107 | 133 | 136 | 138 | 151 | 160 | 176 | 183 | 197 | 225 |
| 24 | 25 | 36 | 44 | 96 | 102 | 106 | 132 | 135 | 137 | 150 | 159 | 175 | 182 | 196 | 224 |
| 23 | 24 | 35 | 43 | 95 | 101 | 105 | 131 | 134 | 136 | 149 | 158 | 174 | 181 | 195 | 223 |
| 22 | 23 | 34 | 42 | 94 | 100 | 104 | 130 | 133 | 135 | 148 | 157 | 173 | 180 | 194 | 222 |
| 21 | 22 | 33 | 41 | 93 | 99 | 103 | 129 | 132 | 134 | 147 | 156 | 172 | 179 | 193 | 221 |
| 20 | 21 | 32 | 40 | 92 | 98 | 102 | 128 | 131 | 133 | 146 | 155 | 171 | 178 | 192 | 220 |
| 19 | 20 | 31 | 39 | 91 | 97 | 101 | 127 | 130 | 132 | 145 | 154 | 170 | 177 | 191 | 219 |
| 18 | 19 | 30 | 38 | 90 | 96 | 100 | 126 | 129 | 131 | 144 | 153 | 169 | 176 | 190 | 218 |
| 17 | 18 | 29 | 37 | 89 | 95 | 99 | 125 | 128 | 130 | 143 | 152 | 168 | 175 | 189 | 217 |
| 16 | 17 | 28 | 36 | 88 | 94 | 98 | 124 | 127 | 129 | 142 | 151 | 167 | 174 | 188 | 216 |
| 15 | 16 | 27 | 35 | 87 | 93 | 97 | 123 | 126 | 128 | 141 | 150 | 166 | 173 | 187 | 215 |
| 14 | 15 | 26 | 34 | 86 | 92 | 96 | 122 | 125 | 127 | 140 | 149 | 165 | 172 | 186 | 214 |
| 13 | 14 | 25 | 33 | 85 | 91 | 95 | 121 | 124 | 126 | 139 | 148 | 164 | 171 | 185 | 213 |
| 12 | 13 | 24 | 32 | 84 | 90 | 94 | 120 | 123 | 125 | 138 | 147 | 163 | 170 | 184 | 212 |
| 11 | 12 | 23 | 31 | 83 | 89 | 93 | 119 | 122 | 124 | 137 | 146 | 162 | 169 | 183 | 211 |
| 10 | 11 | 22 | 30 | 82 | 88 | 92 | 118 | 121 | 123 | 136 | 145 | 161 | 168 | 182 | 210 |
| 9 | 10 | 21 | 29 | 81 | 87 | 91 | 117 | 120 | 122 | 135 | 144 | 160 | 167 | 181 | 209 |
| 8 | 9 | 20 | 28 | 80 | 86 | 90 | 116 | 119 | 121 | 134 | 143 | 159 | 166 | 180 | 208 |
| 7 | 8 | 19 | 27 | 79 | 85 | 89 | 115 | 118 | 120 | 133 | 142 | 158 | 165 | 179 | 207 |
| 6 | 7 | 18 | 26 | 78 | 84 | 88 | 114 | 117 | 119 | 132 | 141 | 157 | 164 | 178 | 206 |
| 5 | 6 | 17 | 25 | 77 | 83 | 87 | 113 | 116 | 118 | 131 | 140 | 156 | 163 | 177 | 205 |
| 4 | 5 | 16 | 24 | 76 | 82 | 86 | 112 | 115 | 117 | 130 | 139 | 155 | 162 | 176 | 204 |
| 3 | 4 | 15 | 23 | 75 | 81 | 85 | 111 | 114 | 116 | 129 | 138 | 154 | 161 | 175 | 203 |
| 2 | 3 | 14 | 22 | 74 | 80 | 84 | 110 | 113 | 115 | 128 | 137 | 153 | 160 | 174 | 202 |
| 1 | 2 | 13 | 21 | 73 | 79 | 83 | 109 | 112 | 114 | 127 | 136 | 152 | 159 | 173 | 201 |
| 0 | 1 | 12 | 20 | 72 | 78 | 82 | 108 | 111 | 113 | 126 | 135 | 151 | 158 | 172 | 200 |
| 0 | 11 | 19 | 71 | 77 | 81 | 107 | 110 | 112 | 125 | 134 | 150 | 157 | 171 | 199 | 254 |
| 10 | 18 | 70 | 76 | 80 | 106 | 109 | 111 | 124 | 133 | 149 | 156 | 170 | 198 | 253 | 254 |
| 9 | 17 | 69 | 75 | 79 | 105 | 108 | 110 | 123 | 132 | 148 | 155 | 169 | 197 | 252 | 253 |
| 8 | 16 | 68 | 74 | 78 | 104 | 107 | 109 | 122 | 131 | 147 | 154 | 168 | 196 | 251 | 252 |
| 7 | 15 | 67 | 73 | 77 | 103 | 106 | 108 | 121 | 130 | 146 | 153 | 167 | 195 | 250 | 251 |
| 6 | 14 | 66 | 72 | 76 | 102 | 105 | 107 | 120 | 129 | 145 | 152 | 166 | 194 | 249 | 250 |
| 5 | 13 | 65 | 71 | 75 | 101 | 104 | 106 | 119 | 128 | 144 | 151 | 165 | 193 | 248 | 249 |
| 4 | 12 | 64 | 70 | 74 | 100 | 103 | 105 | 118 | 127 | 143 | 150 | 164 | 192 | 247 | 248 |
| 3 | 11 | 63 | 69 | 73 | 99 | 102 | 104 | 117 | 126 | 142 | 149 | 163 | 191 | 246 | 247 |
| 2 | 10 | 62 | 68 | 72 | 98 | 101 | 103 | 116 | 125 | 141 | 148 | 162 | 190 | 245 | 246 |
| 1 | 9 | 61 | 67 | 71 | 97 | 100 | 102 | 115 | 124 | 140 | 147 | 161 | 189 | 244 | 245 |
| 0 | 8 | 60 | 66 | 70 | 96 | 99 | 101 | 114 | 123 | 139 | 146 | 160 | 188 | 243 | 244 |
| 7 | 59 | 65 | 69 | 95 | 98 | 100 | 113 | 122 | 138 | 145 | 159 | 187 | 242 | 243 | 254 |
| 6 | 58 | 64 | 68 | 94 | 97 | 99 | 112 | 121 | 137 | 144 | 158 | 186 | 241 | 242 | 253 |
| 5 | 57 | 63 | 67 | 93 | 96 | 98 | 111 | 120 | 136 | 143 | 157 | 185 | 240 | 241 | 252 |
| 4 | 56 | 62 | 66 | 92 | 95 | 97 | 110 | 119 | 135 | 142 | 156 | 184 | 239 | 240 | 251 |
| 3 | 55 | 61 | 65 | 91 | 94 | 96 | 109 | 118 | 134 | 141 | 155 | 183 | 238 | 239 | 250 |
| 2 | 54 | 60 | 64 | 90 | 93 | 95 | 108 | 117 | 133 | 140 | 154 | 182 | 237 | 238 | 249 |
| 1 | 53 | 59 | 63 | 89 | 92 | 94 | 107 | 116 | 132 | 139 | 153 | 181 | 236 | 237 | 248 |
| 0 | 52 | 58 | 62 | 88 | 91 | 93 | 106 | 115 | 131 | 138 | 152 | 180 | 235 | 236 | 247 |
| 51 | 57 | 61 | 87 | 90 | 92 | 105 | 114 | 130 | 137 | 151 | 179 | 234 | 235 | 246 | 254 |
| 50 | 56 | 60 | 86 | 89 | 91 | 104 | 113 | 129 | 136 | 150 | 178 | 233 | 234 | 245 | 253 |
| 49 | 55 | 59 | 85 | 88 | 90 | 103 | 112 | 128 | 135 | 149 | 177 | 232 | 233 | 244 | 252 |
| 48 | 54 | 58 | 84 | 87 | 89 | 102 | 111 | 127 | 134 | 148 | 176 | 231 | 232 | 243 | 251 |

TABLE 2-continued

| | | | | | | | | | | | | | | | |
|---|---|---|---|---|---|---|---|---|---|---|---|---|---|---|---|
| 47 | 53 | 57 | 83 | 86 | 88 | 101 | 110 | 126 | 133 | 147 | 175 | 230 | 231 | 242 | 250 |
| 46 | 52 | 56 | 82 | 85 | 87 | 100 | 109 | 125 | 132 | 146 | 174 | 229 | 230 | 241 | 249 |
| 45 | 51 | 55 | 81 | 84 | 86 | 99 | 108 | 124 | 131 | 145 | 173 | 228 | 229 | 240 | 248 |
| 44 | 50 | 54 | 80 | 83 | 85 | 98 | 107 | 123 | 130 | 144 | 172 | 227 | 228 | 239 | 247 |
| 43 | 49 | 53 | 79 | 82 | 84 | 97 | 106 | 122 | 129 | 143 | 171 | 226 | 227 | 238 | 246 |
| 42 | 48 | 52 | 78 | 81 | 83 | 96 | 105 | 121 | 128 | 142 | 170 | 225 | 226 | 237 | 245 |
| 41 | 47 | 51 | 77 | 80 | 82 | 95 | 104 | 120 | 127 | 141 | 169 | 224 | 225 | 236 | 244 |
| 40 | 46 | 50 | 76 | 79 | 81 | 94 | 103 | 119 | 126 | 140 | 168 | 223 | 224 | 235 | 243 |
| 39 | 45 | 49 | 75 | 78 | 80 | 93 | 102 | 118 | 125 | 139 | 167 | 222 | 223 | 234 | 242 |
| 38 | 44 | 48 | 74 | 77 | 79 | 92 | 101 | 117 | 124 | 138 | 166 | 221 | 222 | 233 | 241 |
| 37 | 43 | 47 | 73 | 76 | 78 | 91 | 100 | 116 | 123 | 137 | 165 | 220 | 221 | 232 | 240 |
| 36 | 42 | 46 | 72 | 75 | 77 | 90 | 99 | 115 | 122 | 136 | 164 | 219 | 220 | 231 | 239 |
| 35 | 41 | 45 | 71 | 74 | 76 | 89 | 98 | 114 | 121 | 135 | 163 | 218 | 219 | 230 | 238 |
| 34 | 40 | 44 | 70 | 73 | 75 | 88 | 97 | 113 | 120 | 134 | 162 | 217 | 218 | 229 | 237 |
| 33 | 39 | 43 | 69 | 72 | 74 | 87 | 96 | 112 | 119 | 133 | 161 | 216 | 217 | 228 | 236 |
| 32 | 38 | 42 | 68 | 71 | 73 | 86 | 95 | 111 | 118 | 132 | 160 | 215 | 216 | 227 | 235 |
| 31 | 37 | 41 | 67 | 70 | 72 | 85 | 94 | 110 | 117 | 131 | 159 | 214 | 215 | 226 | 234 |
| 30 | 36 | 40 | 66 | 69 | 71 | 84 | 93 | 109 | 116 | 130 | 158 | 213 | 214 | 225 | 233 |
| 29 | 35 | 39 | 65 | 68 | 70 | 83 | 92 | 108 | 115 | 129 | 157 | 212 | 213 | 224 | 232 |
| 28 | 34 | 38 | 64 | 67 | 69 | 82 | 91 | 107 | 114 | 128 | 156 | 211 | 212 | 223 | 231 |
| 27 | 33 | 37 | 63 | 66 | 68 | 81 | 90 | 106 | 113 | 127 | 155 | 210 | 211 | 222 | 230 |
| 26 | 32 | 36 | 62 | 65 | 67 | 80 | 89 | 105 | 112 | 126 | 154 | 209 | 210 | 221 | 229 |
| 25 | 31 | 35 | 61 | 64 | 66 | 79 | 88 | 104 | 111 | 125 | 153 | 208 | 209 | 220 | 228 |
| 24 | 30 | 34 | 60 | 63 | 65 | 78 | 87 | 103 | 110 | 124 | 152 | 207 | 208 | 219 | 227 |
| 23 | 29 | 33 | 59 | 62 | 64 | 77 | 86 | 102 | 109 | 123 | 151 | 206 | 207 | 218 | 226 |
| 22 | 28 | 32 | 58 | 61 | 63 | 76 | 85 | 101 | 108 | 122 | 150 | 205 | 206 | 217 | 225 |
| 21 | 27 | 31 | 57 | 60 | 62 | 75 | 84 | 100 | 107 | 121 | 149 | 204 | 205 | 216 | 224 |
| 20 | 26 | 30 | 56 | 59 | 61 | 74 | 83 | 99 | 106 | 120 | 148 | 203 | 204 | 215 | 223 |
| 19 | 25 | 29 | 55 | 58 | 60 | 73 | 82 | 98 | 105 | 119 | 147 | 202 | 203 | 214 | 222 |
| 18 | 24 | 28 | 54 | 57 | 59 | 72 | 81 | 97 | 104 | 118 | 146 | 201 | 202 | 213 | 221 |
| 17 | 23 | 27 | 53 | 56 | 58 | 71 | 80 | 96 | 103 | 117 | 145 | 200 | 201 | 212 | 220 |
| 16 | 22 | 26 | 52 | 55 | 57 | 70 | 79 | 95 | 102 | 116 | 144 | 199 | 200 | 211 | 219 |
| 15 | 21 | 25 | 51 | 54 | 56 | 69 | 78 | 94 | 101 | 115 | 143 | 198 | 199 | 210 | 218 |
| 14 | 20 | 24 | 50 | 53 | 55 | 68 | 77 | 93 | 100 | 114 | 142 | 197 | 198 | 209 | 217 |
| 13 | 19 | 23 | 49 | 52 | 54 | 67 | 76 | 92 | 99 | 113 | 141 | 196 | 197 | 208 | 216 |
| 12 | 18 | 22 | 48 | 51 | 53 | 66 | 75 | 91 | 98 | 112 | 140 | 195 | 196 | 207 | 215 |
| 11 | 17 | 21 | 47 | 50 | 52 | 65 | 74 | 90 | 97 | 111 | 139 | 194 | 195 | 206 | 214 |
| 10 | 16 | 20 | 46 | 49 | 51 | 64 | 73 | 89 | 96 | 110 | 138 | 193 | 194 | 205 | 213 |
| 9 | 15 | 19 | 45 | 48 | 50 | 63 | 72 | 88 | 95 | 109 | 137 | 192 | 193 | 204 | 212 |
| 8 | 14 | 18 | 44 | 47 | 49 | 62 | 71 | 87 | 94 | 108 | 136 | 191 | 192 | 203 | 211 |
| 7 | 13 | 17 | 43 | 46 | 48 | 61 | 70 | 86 | 93 | 107 | 135 | 190 | 191 | 202 | 210 |
| 6 | 12 | 16 | 42 | 45 | 47 | 60 | 69 | 85 | 92 | 106 | 134 | 189 | 190 | 201 | 209 |
| 5 | 11 | 15 | 41 | 44 | 46 | 59 | 68 | 84 | 91 | 105 | 133 | 188 | 189 | 200 | 208 |
| 4 | 10 | 14 | 40 | 43 | 45 | 58 | 67 | 83 | 90 | 104 | 132 | 187 | 188 | 199 | 207 |
| 3 | 9 | 13 | 39 | 42 | 44 | 57 | 66 | 82 | 89 | 103 | 131 | 186 | 187 | 198 | 206 |
| 2 | 8 | 12 | 38 | 41 | 43 | 56 | 65 | 81 | 88 | 102 | 130 | 185 | 186 | 197 | 205 |
| 1 | 7 | 11 | 37 | 40 | 42 | 55 | 64 | 80 | 87 | 101 | 129 | 184 | 185 | 196 | 204 |
| 0 | 6 | 10 | 36 | 39 | 41 | 54 | 63 | 79 | 86 | 100 | 128 | 183 | 184 | 195 | 203 |
| 5 | 9 | 35 | 38 | 40 | 53 | 62 | 78 | 85 | 99 | 127 | 182 | 183 | 194 | 202 | 254 |
| 4 | 8 | 34 | 37 | 39 | 52 | 61 | 77 | 84 | 98 | 126 | 181 | 182 | 193 | 201 | 253 |
| 3 | 7 | 33 | 36 | 38 | 51 | 60 | 76 | 83 | 97 | 125 | 180 | 181 | 192 | 200 | 252 |
| 2 | 6 | 32 | 35 | 37 | 50 | 59 | 75 | 82 | 96 | 124 | 179 | 180 | 191 | 199 | 251 |
| 1 | 5 | 31 | 34 | 36 | 49 | 58 | 74 | 81 | 95 | 123 | 178 | 179 | 190 | 198 | 250 |
| 0 | 4 | 30 | 33 | 35 | 48 | 57 | 73 | 80 | 94 | 122 | 177 | 178 | 189 | 197 | 249 |
| 3 | 29 | 32 | 34 | 47 | 56 | 72 | 79 | 93 | 121 | 176 | 177 | 188 | 196 | 248 | 254 |
| 2 | 28 | 31 | 33 | 46 | 55 | 71 | 78 | 92 | 120 | 175 | 176 | 187 | 195 | 247 | 253 |
| 1 | 27 | 30 | 32 | 45 | 54 | 70 | 77 | 91 | 119 | 174 | 175 | 186 | 194 | 246 | 252 |
| 0 | 26 | 29 | 31 | 44 | 53 | 69 | 76 | 90 | 118 | 173 | 174 | 185 | 193 | 245 | 251 |
| 25 | 28 | 30 | 43 | 52 | 68 | 75 | 89 | 117 | 172 | 173 | 184 | 192 | 244 | 250 | 254 |
| 24 | 27 | 29 | 42 | 51 | 67 | 74 | 88 | 116 | 171 | 172 | 183 | 191 | 243 | 249 | 253 |
| 23 | 26 | 28 | 41 | 50 | 66 | 73 | 87 | 115 | 170 | 171 | 182 | 190 | 242 | 248 | 252 |
| 22 | 25 | 27 | 40 | 49 | 65 | 72 | 86 | 114 | 169 | 170 | 181 | 189 | 241 | 247 | 251 |
| 21 | 24 | 26 | 39 | 48 | 64 | 71 | 85 | 113 | 168 | 169 | 180 | 188 | 240 | 246 | 250 |
| 20 | 23 | 25 | 38 | 47 | 63 | 70 | 84 | 112 | 167 | 168 | 179 | 187 | 239 | 245 | 249 |
| 19 | 22 | 24 | 37 | 46 | 62 | 69 | 83 | 111 | 166 | 167 | 178 | 186 | 238 | 244 | 248 |
| 18 | 21 | 23 | 36 | 45 | 61 | 68 | 82 | 110 | 165 | 166 | 177 | 185 | 237 | 243 | 247 |
| 17 | 20 | 22 | 35 | 44 | 60 | 67 | 81 | 109 | 164 | 165 | 176 | 184 | 236 | 242 | 246 |
| 16 | 19 | 21 | 34 | 43 | 59 | 66 | 80 | 108 | 163 | 164 | 175 | 183 | 235 | 241 | 245 |
| 15 | 18 | 20 | 33 | 42 | 58 | 65 | 79 | 107 | 162 | 163 | 174 | 182 | 234 | 240 | 244 |
| 14 | 17 | 19 | 32 | 41 | 57 | 64 | 78 | 106 | 161 | 162 | 173 | 181 | 233 | 239 | 243 |
| 13 | 16 | 18 | 31 | 40 | 56 | 63 | 77 | 105 | 160 | 161 | 172 | 180 | 232 | 238 | 242 |
| 12 | 15 | 17 | 30 | 39 | 55 | 62 | 76 | 104 | 159 | 160 | 171 | 179 | 231 | 237 | 241 |
| 11 | 14 | 16 | 29 | 38 | 54 | 61 | 75 | 103 | 158 | 159 | 170 | 178 | 230 | 236 | 240 |
| 10 | 13 | 15 | 28 | 37 | 53 | 60 | 74 | 102 | 157 | 158 | 169 | 177 | 229 | 235 | 239 |
| 9 | 12 | 14 | 27 | 36 | 52 | 59 | 73 | 101 | 156 | 157 | 168 | 176 | 228 | 234 | 238 |
| 8 | 11 | 13 | 26 | 35 | 51 | 58 | 72 | 100 | 155 | 156 | 167 | 175 | 227 | 233 | 237 |
| 7 | 10 | 12 | 25 | 34 | 50 | 57 | 71 | 99 | 154 | 155 | 166 | 174 | 226 | 232 | 236 |
| 6 | 9 | 11 | 24 | 33 | 49 | 56 | 70 | 98 | 153 | 154 | 165 | 173 | 225 | 231 | 235 |
| 5 | 8 | 10 | 23 | 32 | 48 | 55 | 69 | 97 | 152 | 153 | 164 | 172 | 224 | 230 | 234 |

TABLE 2-continued

| 4 | 7 | 9  | 22 | 31 | 47 | 54 | 68 | 96  | 151 | 152 | 163 | 171 | 223 | 229 | 233 |
|---|---|----|----|----|----|----|----|-----|-----|-----|-----|-----|-----|-----|-----|
| 3 | 6 | 8  | 21 | 30 | 46 | 53 | 67 | 95  | 150 | 151 | 162 | 170 | 222 | 228 | 232 |
| 2 | 5 | 7  | 20 | 29 | 45 | 52 | 66 | 94  | 149 | 150 | 161 | 169 | 221 | 227 | 231 |
| 1 | 4 | 6  | 19 | 28 | 44 | 51 | 65 | 93  | 148 | 149 | 160 | 168 | 220 | 226 | 230 |
| 0 | 3 | 5  | 18 | 27 | 43 | 50 | 64 | 92  | 147 | 148 | 159 | 167 | 219 | 225 | 229 |
| 2 | 4 | 17 | 26 | 42 | 49 | 63 | 91 | 146 | 147 | 158 | 166 | 218 | 224 | 228 | 254 |
| 1 | 3 | 16 | 25 | 41 | 48 | 62 | 90 | 145 | 146 | 157 | 165 | 217 | 223 | 227 | 253 |
| 0 | 2 | 15 | 24 | 40 | 47 | 61 | 89 | 144 | 145 | 156 | 164 | 216 | 222 | 226 | 252 |

Figure 7:
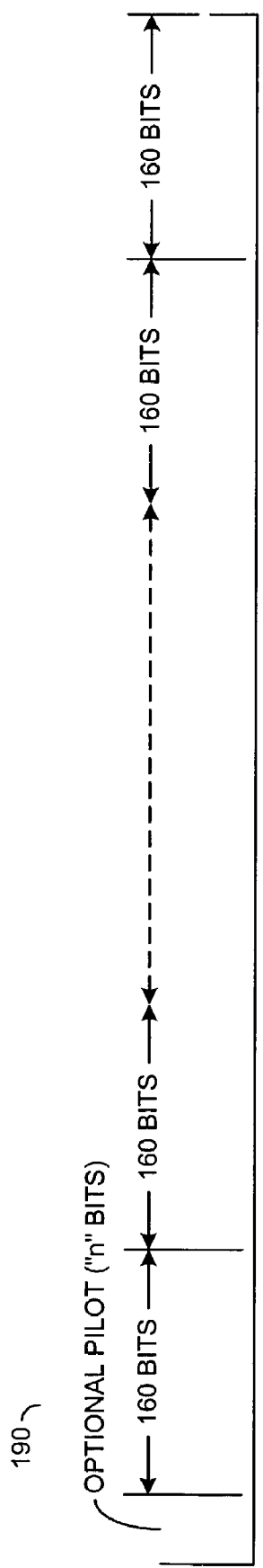
FIG. 7 is a diagram illustrating an example of a construction of the input to a LDPC encoder from a block interleaver output.

Referring to FIG. 7, a diagram 190 illustrating the construction of the input generated by the symbol or frame interleaver stage 106 that may be provided to the LDPC encoder stage 108 is shown. The stage 108 may comprise a variable rate LDPC inner encoder. In one example, the inner encoder may use a shortened version of a 2 dimensional (255, 175) Euclidean Geometry (EG) LDPC code defined over a EG(2, $2^4$). The variable rate for a cyclic EG-LDPC code may be achieved by suitably puncturing the information and the parity bits. The resulting (239,160) shortened EG-LDPC code may be constructed by an appropriate puncturing of 15 information bits and 1 parity bit of the (255, 175) mother code. An example of the (255, 175) mother code may be represented by the [H] matrix given in Table 2.

The optional stage 114 may implement synchronization. The binary LDPC code word block of the present example may comprise 160 bits. Thus, a single RS(200,188) codeword may provide for (8*200 bits)/160=10 blocks. Further, a single source frame 180 after RS encoding may comprise 200 RS encoded blocks. This may correspond to a total of 10×200=2000 input blocks 190 for the LDPC encoder 108. With a systematic implementation of a generator matrix for both the RS and LDPC codes, the b8 hexadecimal value illustrated in FIG. 5 may still be maintained as the first input byte of the overall RS encoded frame 180 going into the systematic LDPC encoder 108. Hence, the b8 hexadecimal value may also be the first output byte of the LDPC encoded frame. To aid in carrier recovery, n optional pilot symbols may be inserted after each LDPC encoded frame (e.g., after every 239×10×200=478,000 bits). These pilot symbols may be removed by the receiver during demodulation.

Figure 8:
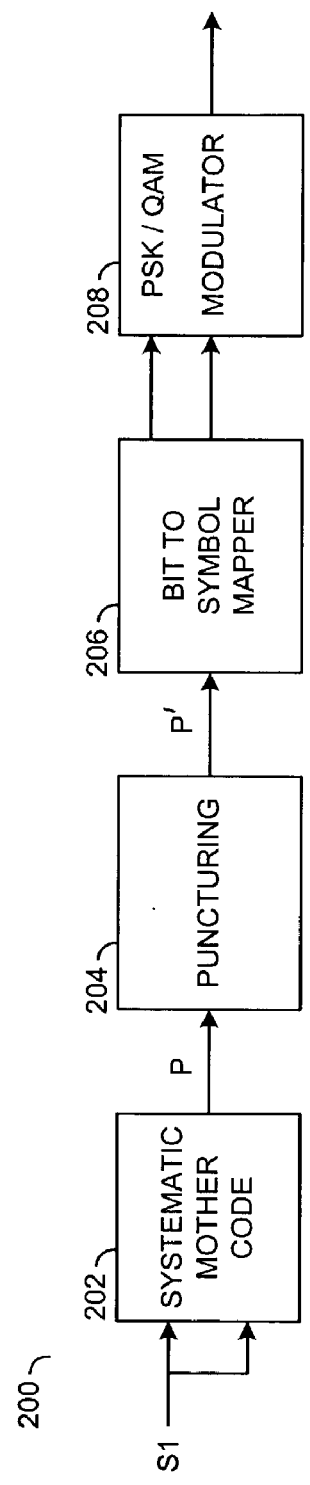
FIG. 8 is a flow diagram illustrating an example of an encoder bit-to-symbol mapper and modulator for a nPSK/mQAM system.

Referring to FIG. 8, a block diagram of a process comprising an encoder, bit to symbol mapper and modulator for an example n-level Phase-Shift Keying/m-level Quadrature Amplitude Modulation (nPSK/mQAM) system 200 is shown. The nPSK/mQAM system 200 may be an expanded view of an example implementation of the steps 108, 110, and 112 of FIG. 2. The nPSK/mQAM system may comprise a stage 202, a stage 204, a stage 206, and a stage 208. The stage 202 may apply the systemic mother code example [H] matrix of TABLE 2 to achieve inner coding. The stage 204 may perform the puncturing operation. The stage 206 may comprise a bit-to-symbol mapper that may be similar to the bit-to-symbol mapper of stage 110 of FIG. 2. The stage 208 may perform a final stage PSK/QAM modulation.

Figure 9:
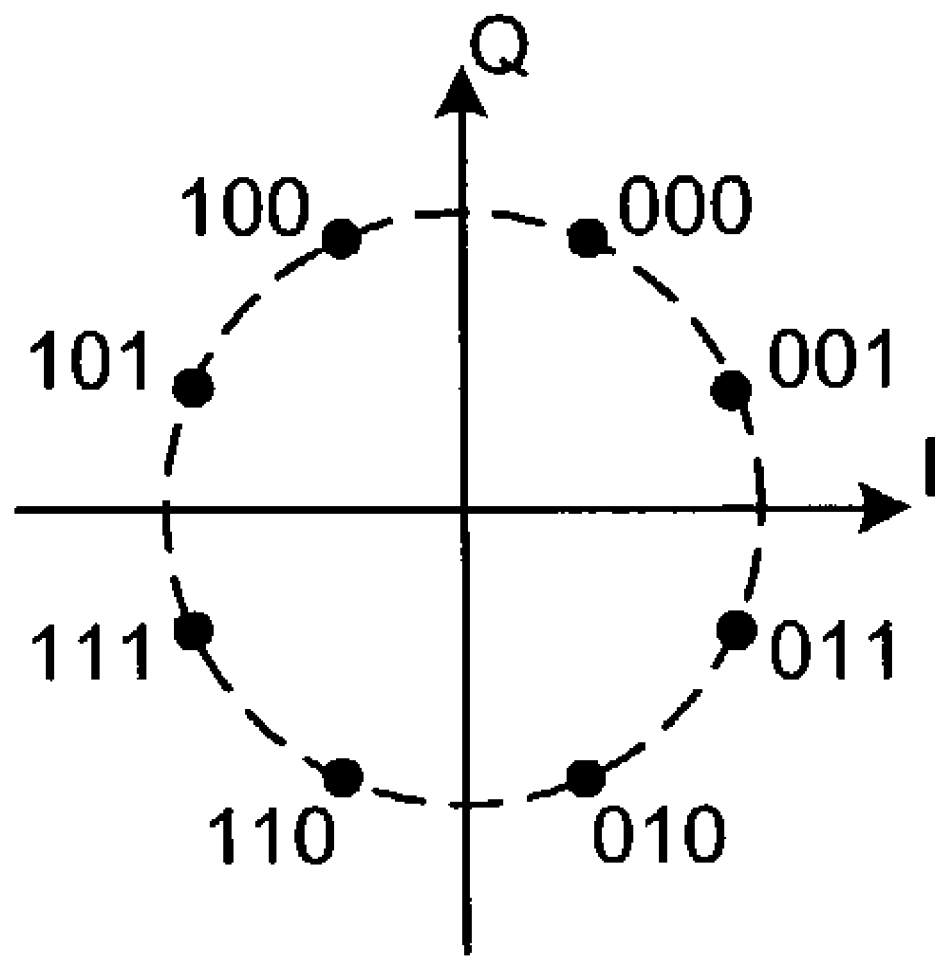
FIG. 9 is a diagram illustrating an example bits-to-8PSK symbol mapping used in satellite 8PSK.

Referring to FIG. 9, a bits-to-8PSK symbol mapping example used in satellite 8PSK is shown. The stage 110 of FIG. 2 may comprise modulation using bit-to-symbol mapping. An example of a bit-to-symbol gray mapping process is shown in FIG. 9. Other schemes that perform bit interleaving before the symbol mapping may also be used to improve performance under certain conditions.

Referring back to FIG. 2, the stage 112 may comprise a modulator. The modulator may apply, in one example, 8/4/2-PSK modulation. The stage 113 may filter the output of stage 112 (e.g., the modulated data stream). The output of the stage 113 may provide the signal to be broadcast in the digital broadband transmission system. While 8/4/2-PSK and PSK/QAN modulation have been shown, any type of modulation can be used to meet the design criteria of a particular application.

The following TABLE 3 illustrates ideal channel and demodulation simulation results:

TABLE 3

Theoretical Linear Channel Performances

| Modulation Format | Inner Chan. b/sym | Inner Code Type | Rs [Mbps] | Inner Code Rate | Outer Code Rate | Framing Overhead | Ru Useful Rate [Mbps] | Efficiency [bits/sym] | BER after inner decoder [dB] | Eb/No after inner decoder [dB] | Eb/No @ Ru [dB] | C/N @ QEF [dB] | linear channel C/No @ QEF [dB] |
|---|---|---|---|---|---|---|---|---|---|---|---|---|---|
| DVB QPSK | 2 | viterbi | 21.5 | 0.750 | 0.922 | n.a. | 29.72 | 1.38 | 2.00E−04 | 4.35 | 4.70 | 6.11 | 1.44 |

Although the proposed outer code structure was previously defined as being RS(200,188), DVB-S RS(204,188) is also considered for comparison. For a given signal byte error rate (ByteER) p supplied at an input to a RS(N, N-2T) decoder, the output byte error rate q is given by the formula:

$$q = \sum_{i=T+1}^{N} {}^{N-1}C_{i-1} p^i (1-p)^{N-i}.$$

Here, N is the RS codeword length and T is the correction power of the code. The estimated gain margin obtained in the example case of using an inner LDPC code may be sufficient to compensate for a higher 8PSK demodulator performance loss and also for higher distortion effects on the 8PSK constellation by the satellite transponder.

The function performed by the flow diagram of FIG. 2 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMS, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
a first circuit configured to generate (i) one or more motion picture expert group (MPEG) packets, (ii) one or more MPEG data frames from said one or more MPEG packets and (iii) an MPEG data stream from said one or more MPEG data frames; and
a second circuit comprising (i) a first stage configured to scramble said MPEG data stream to generate a scrambled data stream, (ii) a second stage configured to encode said scrambled data stream to generate an encoded data stream, (iii) a third stage configured to (a) interleave said encoded data stream to generate an interleaved data stream and (b) provide error correction for a decoder at a receiver, (iv) a fourth stage comprising a low density parity code encoder having a variable rate and configured to encode said interleaved data stream and (v) a fifth stage configured to (a) modulate said encoded interleaved data stream to generate a modulated data stream and (b) filter said modulated data stream to generate an output stream, wherein said fourth stage operates with a shortened version of a low density parity check code such that said output stream fits through a communication channel while carrying High Definition programming, said communication channel having a maximum symbol rate and a carrier to noise ratio both allocated to non-High Definition television signals and said shortened version comprises a two-dimensionally smaller version of a two dimensional Euclidean Geometry low density parity check code.

2. The apparatus according to claim 1, wherein said first stage comprises an energy dispersal bitwise scrambler that applies a randomization polynomial.

3. The apparatus according to claim 1, wherein said second stage comprises a Reed Solomon encoder configured to perform outer coding on said scrambled data stream.

4. The apparatus according to claim 1, wherein said third stage comprises a frame interleaver configured to interleave said MPEG data frames in said encoded data stream.

5. The apparatus according to claim 1, wherein said fifth stage is configured to perform modulation by applying a bit to symbol mapping process.

6. The apparatus according to claim 1, wherein said fifth stage performs modulation with an 8 or 4 or 2 level phase shift key modulator.

7. An apparatus comprising:
means for generating (i) one or more motion picture expert group (MPEG) packets, (ii) one or more MPEG data frames from one or more MPEG packets and (iii) an MPEG data stream from one or more MPEG data frames; and
means for (i) scrambling said data stream to generate a scrambled data stream, (ii) encoding said scrambled data stream to generate an encoded data stream, (iii) interleaving said encoded data stream, (iv) providing error correction for a decoder at a receiver, (v) encoding said interleaved data stream, (vi) modulating said encoded interleaved data stream, and (vii) filtering said modulated data stream to generate an output stream, wherein said means for encoding said interleaved data stream operates with a shortened version of a low density parity check code such that said output stream fits through a communication channel while carrying High Definition programming, said communication channel having a maximum symbol rate and a carrier to noise ratio both allocated to non-High Definition television signals and said shortened version comprises a two-dimensionally smaller version of a two dimensional Euclidean Geometry low density parity check code.

8. A method of transmitting broadband signals using low density parity code based modulation comprising the steps of:
(A) packing transport stream bytes from a motion picture expert group (MPEG) source encoder into one or more MPEG packets;
(B) generating one or more MPEG data frames from said one or more MPEG packets;
(C) generating an MPEG data stream from said one or more MPEG data frames;
(D) applying randomization to said MPEG data stream using a circuit;
(E) applying an outer coding to said MPEG data stream;
(F) applying a frame interleaving to said MPEG data stream;
(G) providing error correction for a decoder at a receiver with said frame interleaving;
(H) encoding said MPEG data stream with a low density parity code encoder;
(I) modulating said MPEG data stream with bit to symbol mapping; and
(J) modulating said MPEG data stream with a final stage modulator to generate an output data stream, wherein said encoding of said MPEG data stream in step (H) operates with a shortened version of a low density parity check code such that said output data stream fits through a communication channel while carrying High Definition programming, said communication channel having a maximum symbol rate and a carrier to noise ratio both allocated to non-High Definition television signals and said shortened version comprises a two-dimensionally smaller version of a two dimensional Euclidean Geometry low density parity check code.

9. The method according to claim 8 further comprising the step of:
(K) implementing synchronization by adding pilot symbols after each of an encoded frame.

10. The method according to claim 8 wherein the randomization of step (D) comprises bit-wise energy dispersal that applies a randomization polynomial.

11. The method according to claim 8 wherein the outer coding of step (E) comprises a Reed-Solomon encoding with a length of at most 200 bytes, said length including at most 12 check bytes.

12. The method according to claim 8 wherein said method is applied to work in conjunction with an existing digital television set-top box.

13. The method according to claim 9 wherein said synchronization comprises inserting pilot bits after a low density parity code encoded frame, said synchronization is implemented after step (H) and before step (I), and said pilot bits are used for synchronization at said receiver.

14. The method according to claim 8 wherein the final stage modulator of step (J) comprises an 8 or 4 or 2 level Phase-Shift Keying modulator.

15. The apparatus according to claim 1, wherein each of said MPEG data frame comprises a synchronization byte inserted before each of said MPEG packet.

16. The apparatus according to claim 1, wherein each of said MPEG data frames comprises an inverted synchronization byte inserted before a first MPEG packet, wherein said inverted synchronization byte enables proper synchronization for each of said MPEG data frame.

17. The apparatus according to claim 1, wherein said third stage comprises an interleaver configured to provide error correction by adding parity to said interleaved data stream to reduce the probability of bit errors occurring at said decoder of said receiver.

18. The apparatus according to claim 15, wherein said first stage is disabled from scrambling said synchronization byte inserted before each of said MPEG packet in said MPEG data frame.

19. The apparatus according to claim 1, wherein said high definition television comprises a 720p signal or a 1080i signal.

20. The apparatus according to claim 1, wherein said apparatus operates as part of a satellite system physical layer deployed in a set-top box configured to receive Direct Broadcast Satellite (DBS) transmissions as a carrier for said high definition programming.

21. The apparatus according to claim 1, wherein communication channel is part of a satellite system allocated to said non-High Definition television signals.

22. The apparatus according to claim 21, wherein said satellite system includes a plurality of transponders, at least one of said transponders being configured to transfer said output stream.

23. The apparatus according to claim 1, wherein said two dimensional Euclidean Geometry low density parity check code comprises a (255, 175) code.

24. The apparatus according to claim 23, wherein said shortened version comprises said two dimensional Euclidean Geometry low density parity check code with a plurality of information bits removed and a parity bit removed.

25. The apparatus according to claim 1, wherein said second stage generates an encoded frame comprising a plurality of 200-byte rows.

26. The apparatus according to claim 25, wherein said third stage interleaves said encoded frame into a plurality of 160-bit codewords.

27. The apparatus according to claim 26, wherein said shortened version comprises a (239, 160) code.

* * * * *